United States Patent [19]

Rhines

[11] Patent Number: 4,479,239
[45] Date of Patent: Oct. 23, 1984

[54] SOUND DETECTING DEVICE
[75] Inventor: David W. Rhines, Sheboygan, Wis.
[73] Assignee: Silver Creek Nurseries, Inc., Manitowoc, Wis.
[21] Appl. No.: 479,295
[22] Filed: Mar. 28, 1983
[51] Int. Cl.³ .............................................. H03G 3/00
[52] U.S. Cl. .................................... 381/72; 381/107; 381/120
[58] Field of Search ....... 179/107 R, 121 D, 107 FD; 381/56, 57, 72, 74, 71, 92, 122, 94, 95, 104–109, 111–114, 120, 121

[56] References Cited
U.S. PATENT DOCUMENTS 3,243,525  3/1966  Eaton .............................. 179/107 R
3,894,195  7/1975  Kryter ............................ 179/107 FD
4,224,470  9/1980  Persson et al. ........................ 381/72
4,247,955  1/1981  Weidemann ...................... 381/57 X Primary Examiner—Gene Z. Rubinson
Assistant Examiner—W. J. Brady
Attorney, Agent, or Firm—Allan B Wheeler

[57] ABSTRACT

A sound detecting device for amplifying distant or weak sounds, including a novel loud sound suppressing circuit for temporarily shunting the amplifier input signal to ground whenever the amplifier output signal exceeds a predetermined amplitude. The microphone, amplifier, and sound suppressing circuit are mounted in a wand shaped much like a flashlight. The wand can be attached to headphones.

12 Claims, 3 Drawing Figures

U.S. Patent     Oct. 23, 1984     4,479,239
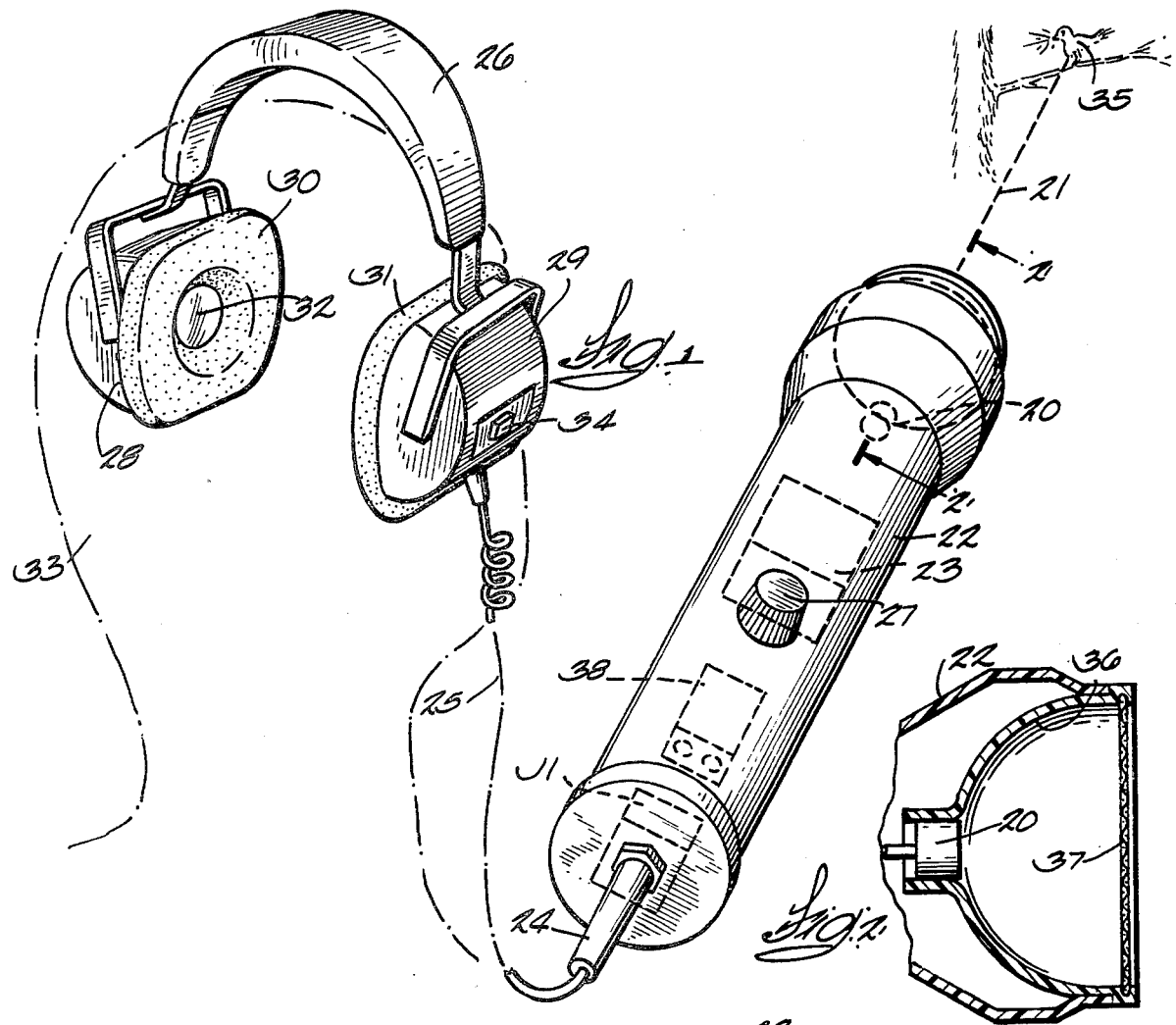
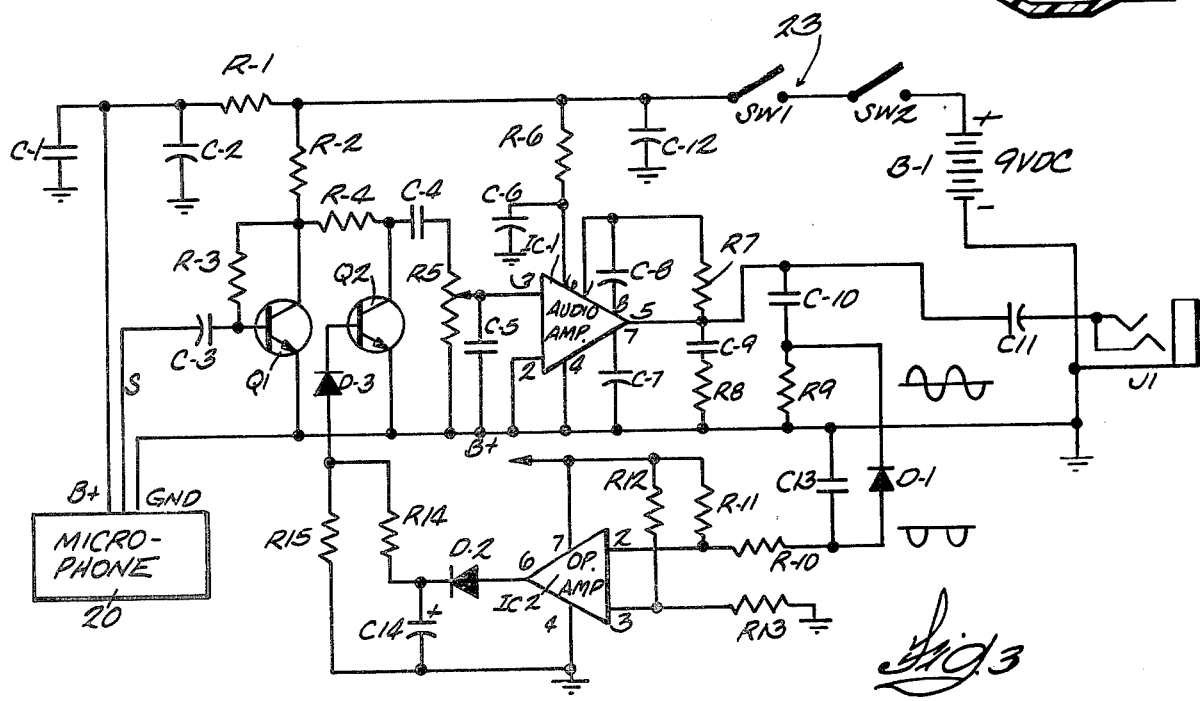

SOUND DETECTING DEVICE

TECHNICAL FIELD

The present invention relates to sound amplifying devices for listening to faint or distant sounds. One particular aspect of the invention is a novel output limiting circuit for such a device to protect the listener and the device when the amplified signal amplitude exceeds a predetermined level.

BACKGROUND ART

Amplifying devices for increasing the amplitude of faint or distant sounds are well known. U.S. Pat. No. 3,243,525, issued to Eaton on Mar. 29, 1966 teaches such a device. A somewhat similar device to correct for a user's hearing loss is taught in U.S. Pat. No. 3,894,195, issued to Kryter on July 8, 1975. Such devices should prevent damage to the user's ears and circuit elements when the microphone element is directed toward an unusually loud sound source.

While the art is aware of dynamic range compressing circuits for rendering all sounds (whether loud or soft) at a constant amplitude, the output of such a circuit lacks much of the character of the original sounds. Other known circuits employ filters to reduce the amplitude of certain aspects of the signal without affecting other portions of the signal. While such filtering circuits can be tailored to a particular application, a listening device including filtering circuits adapted for a wide variety of uses would inevitably filter out some desirable sounds and pass some objectionable sounds. The Kryter patent identified previously does disclose the concept of reducing the gain of an amplifier if an incoming signal exceeds a predetermined amplitude, recovering when the signal returns to a more moderate amplitude. But Kryter does not illustrate a circuit for accomplishing this aim.

SUMMARY OF THE INVENTION

The invention is a sound detecting device comprising a microphone for detecting faint or distant sounds, an amplifier for producing an output signal of greater amplitude than the input signal provided by the microphone, and a loud sound suppressing circuit which shunts the input signal to ground when the amplitude of the amplifier output signal exceeds a predetermined level. In the typical device the amplifier output is fed to a speaker, preferably a headset providing acoustical isolation between the speakers and the microphone (primarily to prevent feedback).

The preferred loud sound suppressing circuit comprises a comparator element such as an operational amplifier which compares the amplifier output amplitude with a reference bias signal and generates a suppression signal at its output whenever the amplifier output exceeds its predetermined level. The suppression signal is conducted to a variable impedance element which is shunted from the amplifier input to ground. When a suppression signal is generated the variable impedance element, which normally has a high impedance, becomes a low impedance device, shunting the amplifier input signal to ground.

If the variable impedance element is a transistor, its base receives the suppression signal and its collector and emitter are connected to the signal and ground input terminals of the amplifier. The polarity of the suppression signal is such as to saturate the transistor, thereby providing a low impedance path between its collector and emitter.

The comparator can also produce a circuit defeating signal for biasing the variable impedance element to present a high impedance shunt (effectively an open circuit) across the amplifier input except when the suppression signal replaces the circuit defeating signal. If the variable impedance element is a transistor, the circuit defeating signal biases the base of the transistor substantially beyond its cut-off point, thereby ensuring a high impedance between the collector and emitter of the transistor.

In the preferred embodiment of the invention a resistance-capacitance-diode network is connected between the comparator output and the variable impedance element for briefly sustaining the suppression signal for a second or two after the amplifier output signal amplitude (voltage level) falls below the predetermined maximum level. The resulting quiet interval after a loud sound is suppressed is an audible indication that the loud sound suppression circuit has operated. This feature also prevents the variable impedance device from amplifying the transient suppression signal, thus retriggering suppression.

Other features and advantages of the invention will become apparent from the description which follows.

BRIEF DESCRIPTION OF DRAWING

FIG. 1 is a schematic perspective view of the invention being used by an operator to amplify a distant sound.

FIG. 2 is a fragmentary longitudinal section taken along line 2—2 of FIG. 1.

FIG. 3 is a schematic diagram of the sound detecting and loud sound suppressing portions of the device of FIG. 1.

DETAILED DESCRIPTION OF THE PREFERRED EMBODIMENTS

Although the disclosure hereof is detailed and exact to enable those skilled in the art to practice the invention, the physical embodiments herein disclosed merely exemplify the invention which may be embodied in other specific structure. While the best known embodiment has been described, the details may be changed without departing from the invention, which is defined by the claims.

FIGS. 1 and 2 illustrate how the sound detecting device of the present invention is conveniently arranged for detection of distant or faint sounds which could not otherwise be perceived. Microphone means 20, here an electret condenser microphone but possibly other types of microphones or transducers, is mounted with its axis 21 of maximum sensitivity lying along the longitudinal axis of a wand 22 within which the circuit 23 shown in FIG. 2 is mounted. An output jack J-1 is shown for receiving the conventional input plug 24 connected by a flexible cord 25 to headset 26. A combined on-off switch and potentiometer volume control 27 is mounted to wand 22 in this embodiment. Headset 26 comprises ear cups 28 and 29 having acoustically insulated pads 30 and 31 which isolate the speakers such as 32 of headset 26 from the ambient environment, and particularly from the vicinity of microphone means 20, when the device is worn over the ears of a user 33. In this embodiment headset 26 includes individual volume controls such as 34 to allow the user to provide a different volume for each ear. Although a monaural system is shown, the system can easily be adapted for stereophonic listening by providing a second microphone, amplifier, and so forth.

The illustrated embodiment is very simple to use. Wand 22 is pointed so axis 21 intercepts a distant source of sound such as bird 35 (just as a flashlight is pointed). The selected sounds will then normally be amplified by circuit 23 and passed via the speakers such as 32 into the user's ears. An amplified equivalent of the sounds from source 35 will be perceived by the user. In the illustrated embodiment microphone means 20 is mounted within a cup 36 to concentrate the acoustic waves, and an open-celled wind screen 37 is provided.

One useful feature contributing to the economy of the device is that wand 22 and its contents can be used with any conventional headset 26. Also, an output device other than a speaker, such as a sound level gauge, could be substituted for headset 26 without departing from the broadest definition of the invention, as the loud sound suppressing circuit disclosed below can protect electronic apparatus such as a meter movement as well as a user's ears. The description herein, however, will refer primarily to a circuit for protecting a user's ears.

Referring now to the schematic shown in FIG. 3, circuit 23 is constructed and operates as follows. The power for operating the circuit is provided by battery B-1, shown as 38 in FIG. 1. The positive terminal of battery B-1 is isolated from the rest of the circuit by switches SW-1 and SW-2. SW-1 is incorporated in potentiometer control 27 to allow the user to switch the device off or on. SW-2 is an integral part of J-1 and automatically opens if input plug 24 is removed from J-1.

Microphone 20 gets its bias voltage at its B+ terminal from a decoupling filter comprising R-1 and grounded capacitors C-1 and C-2 to prevent motorboating. Microphone 20 also has a ground terminal (GND) and signal terminal (S).

The alternating current signal taken from the (S) terminal of microphone 20 is amplified in two stages during normal operation of the device. The signal is first passed through a coupling capacitor C-3 to the base of preamplifier transistor Q-1. Collector resistor R-2 and collector to base resistor R-3 drop the collector bias and base bias to their prescribed values for operation. In this embodiment the preamplifier stage has a voltage gain of about 250. Ignoring for now Q-2 and D-3, which are part of the loud sound suppression circuit, the preamplifier output signal is coupled via R-4 and C-4 to the resistance element of R-5—the potentiometer of control 27. The sliding contact of R-5 is adjusted to reduce the gain of the preamplifier to a desirable level. C-5 is optionally provided to prevent generation of ultrasonic oscillations by the system when gain is much higher—when C-8 is added.

IC-1 is deployed and functions as follows: The signal is passed to the input terminals (2 and 3) of amplifier IC-1, of which the former terminal is grounded. Direct current bias voltage is supplied to amplifier IC-1 via a decoupling and stabilizing filter provided by R-6 and C-6. C-7 filters and decouples the voltage supply for the input amplifier section within IC-1. C-8 is optional for a high gain amplifier, and increases the gain of the particular IC-1 used here from 20 to a substantially higher value, potentially as high as 200. R-7 is included to reduce high frequency hiss in the amplifier output, when C-8 is included. R-8 and C-9 further stabilize the signal at high frequency and provide extra loading to protect IC-1 if the circuit to speaker means 32 becomes open or if SW-2 fails to open when input plug 24 is removed from J-1. R-9 and C-10 contribute to the function of R-8 and C-9, and C-10 also isolates the DC component taken from output 5 of IC-1 from the input of the loud sound suppressing circuit described below. Coupling capacitor C-11 passes the amplified signal to the output at terminal J-1 and C-12 passes unwanted AC signals from the battery supply to ground.

In the preferred embodiment of the invention, the gain of IC-1 is substantially linear for all audio frequencies and for a broad range of signal input amplitudes, thereby providing amplification of the input signal with minimal alteration thereof. It will be appreciated, however, that the invention will also have utility in sound detecting devices which do not meet these limitations.

The remaining circuit elements form a loud sound suppressing circuit operatively associated with the previously described amplifier for temporarily shunting to ground the input signal usually presented across R-5 whenever the output signal presented at terminal 5 of IC-1 exceeds a predetermined amplitude. The main components of the loud sound suppression circuit are a comparator IC-2 and a variable impedance element Q-2 which is (indirectly) shunted across the input terminals 2 and 3 of IC-1.

IC-2 has first and second inputs at terminals 2 and 3 for receiving signals to be compared. Input 2 is an inverting input and input 3 is a noninverting input. The negative phase of the amplified signal is fed from the output of IC-1 to the inverting terminal 2 of IC-2 as follows. C-10 filters out any DC component taken from terminal 5 of IC-1, while R-9 and D-1 are the respective signal paths for the positive and negative phases of the output signal from IC-1. The rectified, negative phase output signal passing through D-1 is passed via resistor R-10 to terminal 2. Capacitor C-13 is included to provide extra stability and to reduce high frequency noise. Terminal 2 is positively biased via resistor R-11 connected to the positive side of the battery supply. The bias at terminal 2 is determined by the resistances of R-9, R-10, R-11, and the forward voltage drop of D-1. The bias to the noninverting input 3 of IC-2 is provided by a voltage divider comprising resistors R-12 and R-13. IC-2 has a switching point of approximately +0.5 volts in this embodiment.

Under low signal amplitude conditions at terminal 5 of IC-1, the inverting input of IC-2 has a higher bias voltage than the noninverting input, so IC-2 normally remains in its low state. Whenever the amplitude of the signal from terminal 5 of IC-1 is large enough to reduce the positive bias at terminal 2 of IC-2 to a level less than the bias at terminal 3 of IC-2, corresponding to the amplification of a sound of excessive loudness, the output of IC-2 is shifted from its low state to its high state very rapidly. This high state output of IC-2, sometimes referred to herein as a suppression signal, passes from terminal 6 of IC-2, via D-2, R-14, and D-3, to the base of variable impedance device (transistor) Q-2.

The suppression signal is large enough to saturate Q-2, thus causing a low impedance path between its collector and emitter, which in effect bridge the input terminals 2 and 3 of IC-1. (In this embodiment Q-2 is shunted indirectly across IC-1, as filter capacitor C-4 and potentiometer R-5 are interposed.) R-2 and R4 supply the collection bias needed to drive Q-2 into saturation (necessary to saturate, and cause the low impedance of transistor Q-2). Thus, when a suppression signal is supplied to transistor Q-2 the input signal of IC-1 is effectively extinguished.

It will be appreciated that the suppression signal is generated at terminal 6 of IC-2 and thus presented at the base of Q-2 only at the instant the output of IC-1 exceeds the predetermined amplitude which triggers IC-2. Furthermore, if IC-2 produces a practically square wave pulse of short duration as the suppression signal, that pulse will be amplified at Q-2, forming a transient signal at the output of IC-1 that will again trigger a suppression signal. To eliminate this self-retriggering problem, a resistance-capacitance-diode network is operatively connected between the output of IC-2 and the base of Q-2. When IC-2 is triggered as previously described, part of the suppression signal charges C-14. When the compression signal ceases, C-14 temporarily maintains the potential at the base of Q-2 at the potential of the compression signal. C-14 discharges through R-14 and R-15 sufficiently slowly that no transient AC signal having a substantial frequency is produced. The potential low-resistance discharge path for C-14 through terminals 6 and 4 of IC-2 is blocked by D-2. In the circuit shown here C-14, R-14, and R-15 are so sized that Q-2 will remain saturated (and no signal will be amplified) for roughly two seconds after the suppression signal ceases. This time delay provides an audible indication to the user that the device is pointed at a source of sound of excessive intensity, encouraging redirection of the device.

Finally, IC-2 provides a circuit defeating signal in this embodiment for biasing Q-2 to cut-off except when a suppression signal is provided at the output of IC-2. This ensures that the impedance across Q-2 remains high except when a suppression signal is fed to it.

One example of circuit 23 has the component values set forth in Table I below:

TABLE 1

| Capacitors | Values | Resistors | Values (ohms) |
|---|---|---|---|
| C-1 | 0.1 mfd. | R-1 | 3,900 |
| C-2 | 47 mfd. | R-2 | 3,900 |
| C-3 | 10 mfd. | R-3 | 180K |
| C-4 | 0.1 mfd. | R-4 | 10K |
| C-5 | 100 pf. | R-5 | 100K pot |
| C-6 | 220 mfd. | R-6 | 10 |
| C-7 | 47 mfd. | R-7 | 15K |
| C-8 | 10 mfd. | R-8 | 10 |
| C-9 | 0.1 mfd. | R-9 | 100K |
| C-10 | 0.1 mfd. | R-10 | 27K |
| C-11 | 220 mfd. | R-11 | 100K |
| C-12 | 220 mfd. | R-12 | 100K |
| C-13 | .001 mfd. | R-13 | 100K |
| C-14 | 10 mfd. | R-14 | 180K |
|  |  | R-15 | 100K |

Q-1 and Q-2 are NPN transistors such as types PN 2222 or 2N3904. IC-1 is a LM386N amplifier and IC-2 is a type 741N operational amplifier, each available from National Semiconductor Corp. D-1, D-2, and D-3 are each a type 1N914 diode.

I claim:
1. A sound detecting device, comprising:
   A. microphone means for being directed toward a source of sound to produce a corresponding electrical input signal;
   B. amplifier means having an input and an output, said input being connected to said microphone means to receive said input signal and said output providing an output signal; and
   C. a loud sound suppressing circuit operatively associated with said amplifier means for temporarily shunting said input signal to ground while said output signal exceeds a predetermined level.
2. The sound detecting device of claim 1, wherein said loud sound suppressing circuit comprises:
   A. a comparator having first and second inputs for receiving signals to be compared, said first input being operatively connected to said amplifier output for receiving said amplifier output signal and said second input receiving a predetermined bias voltage, said comparator further including an output for providing a suppression signal whenever the relation between said first and second inputs is such that said amplifier output signal exceeds a predetermined amplitude; and
   B. a variable impedance element shunted from said amplifier input to ground and operatively connected to said comparator output for being biased to present a low impedance shunt whenever a suppression signal is provided at said comparator output.
3. The sound detecting device of claim 2, further comprising a resistance-capacitance network operatively connected between said comparator output and said variable impedance element for maintaining said low impedance shunt for a predetermined time after said suppression signal ceases.
4. The sound detecting device of claim 2, wherein said variable impedance element is a junction transistor having an emitter, a collector, and a base, of which the emitter and collector are connected between said amplifier input and a ground and said base is operatively connected to said comparator output for regulating the impedance between said emitter and collector.
5. The sound detecting device of claim 2, wherein said first input is an inverting input, said second input is a noninverting input, said amplifier output signal including negative phase portions, and only the negative phase of said amplifier output signals is passed to said inverting input, means for producing a predetermined bias voltage presented to said second input, and said suppression signal is provided whenever the net voltage presented to said first input is less than the predetermined bias voltage presented to said second input.
6. The sound detecting device of claim 2, wherein said comparator output further provides a circuit defeating signal for biasing said variable impedance element to present a high impedance shunt across said amplifier input except when a suppression signal is provided at said comparator output.
7. The sound detecting device of claim 1, further comprising preamplifier means operatively disposed between said microphone means and said amplifier means.
8. The sound detecting device of claim 1, further comprising speaker means for being operatively connected to said amplifier output to convert said amplifier output signal into audible sounds.
9. The sound detecting device of claim 8, wherein said speaker means is adapted to be acoustically isolated from said microphone means when in use.
10. The sound detecting device of claim 8, wherein said microphone, amplifier, loud sound suppressing circuit and output terminal means are secured to a wand and said speaker means is connected to said output terminal means by a flexible cord.
11. The listening device of claim 10, wherein said microphone is directional and is mounted coaxially to one end of said wand for responding primarily to the sound source said wand is pointing toward.
12. The sound detecting device of claim 1, wherein said amplifier means has substantially linear gain at audio frequencies.

* * * * *